United States Patent
Brink

(10) Patent No.: US 6,629,287 B1
(45) Date of Patent: Sep. 30, 2003

(54) CHANNEL DECODER AND METHOD OF CHANNEL DECODING

(75) Inventor: Stephan ten Brink, Allmersbach (DE)

(73) Assignee: Agere Systems Inc., Allentown, PA (US)

(*) Notice: Subject to any disclaimer, the term of this patent is extended or adjusted under 35 U.S.C. 154(b) by 374 days.

(21) Appl. No.: 09/659,093

(22) Filed: Sep. 11, 2000

(30) Foreign Application Priority Data

Sep. 14, 1999 (EP) ............................................. 99307246

(51) Int. Cl.$^7$ ............................................. H03M 13/00
(52) U.S. Cl. .................................. 714/755; 714/780
(58) Field of Search .................................. 714/755, 780

(56) References Cited

U.S. PATENT DOCUMENTS

| | | | | | |
|---|---|---|---|---|---|
| 4,596,024 | A | * | 6/1986 | Thomson | 375/347 |
| 5,414,738 | A | * | 5/1995 | Bienz | 375/341 |
| 5,537,444 | A | * | 7/1996 | Nill et al. | 375/341 |
| 5,563,897 | A | * | 10/1996 | Pyndiah et al. | 714/755 |
| 5,815,533 | A | * | 9/1998 | Mourot | 375/341 |
| 5,822,340 | A | * | 10/1998 | Stenstrom et al. | 714/795 |
| 5,966,412 | A | * | 10/1999 | Ramaswamy | 375/341 |
| 6,056,147 | A | * | 5/2000 | Jarman | 220/495.11 |
| 6,122,763 | A | * | 9/2000 | Pyndiah et al. | 714/755 |
| 6,192,501 | B1 | * | 2/2001 | Hladik et al. | 714/786 |
| 6,222,835 | B1 | * | 4/2001 | Franz et al. | 370/349 |
| 6,389,574 | B1 | * | 5/2002 | Belveze et al. | 714/795 |
| 6,397,367 | B1 | * | 5/2002 | Park et al. | 714/786 |

OTHER PUBLICATIONS

S. Benedetto, et al "Iterative Decoding of Serially Concatenated Codes with Interleavers and Comparison with Turbo Codes", "Global Telecommunications Conference, New York, NY, USA, 1997" pp. 654–658.

J. Hagenauer, et al "A Viterbi Algorithm with Soft–Decision Outputs and its Applications" "Proceedings of the Global Telecommunications Conference and Exhibition New York, NY, USA, 1989" pp. 1680–1686.

D. Divsalar, et al "Coding Theorems for "Turbo–Like" Codes". "Proceedigns 36$^{th}$ Annual Allerton Conference on Communication, Control, and Computing, Monticello, IL, USA, Sep. 23–25, 1998", pp. 201–210.

G. Cancellieri, et al "Analysis of Concatenated Reed–Solomon Encoding Schemes with Full and Partial Interleaving for Short Data Messages" "European Transactions on Telecommunications and Related Technologies Milano, Italy, Jan. 1, 1994", pp. 85–91.

A. A. Ali, et al "On the Use of Repetition Coding with Binary DIgital Modulations on Mobile Channels" "IEEE Transactions on Vehicular Technology, Feb. 1989", pp. 14–18.

European Search Report, dated Apr. 25, 2000.

* cited by examiner

Primary Examiner—Albert Decady
Assistant Examiner—Anthony T. Whittington

(57) ABSTRACT

An iterative decoder for serially concatenated encoded data in which an outer code is a rate 1:2 repetition code operative to encode a data bit $b_n$ as two identical and interleaved coded bits $b_{coded,n0}, b_{coded,n1}$. The decoder comprises a soft-input, soft-output inner decoder for which the input and output information are log likelihood ratios, input information being the log likelihood ratios of the encoded data and outer extrinsic information. Feedback outer extrinsic information is substracted from the inner decoder output information to produce inner extrinsic information. The log likelihood ratios $L_{n0}, L_{n1}$, in the inner extrinsic information, corresponding to one information bit $b_n$, are swapped to produce the feed back extrinsic information. The pairs of log likelihood ratios $L_{n0}, L_{n1}$ of the inner extrinsic information are summed to make a hard decision for the correspoding information bit.

6 Claims, 4 Drawing Sheets

CHANNEL DECODER AND METHOD OF CHANNEL DECODING

CROSS-REFERENCE TO RELATED APPLICATION

This application claims priority of European Patent Application No. 99307246.1, which was filed on Sep. 14, 1999.

FIELD OF THE INVENTION

This invention relates to channel decoders and to methods of channel decoding.

BACKGROUND OF THE INVENTION

Channel coding is used to make the transmitted digital information signal more robust against noise. For this the information bit sequence is encoded at the transmitter by a channel encoder and decoded at the receiver by a channel decoder. In the encoder redundant information is added to the information bit sequence in order to facilitate the decoder to perform error correction. For example, in a systematic channel encoding scheme the redundant information is added to the information bit sequence just as additional inserted, 'coded' bits. Hence, the encoded signal consists of both information and coded bits. In a non-systematic encoding scheme the outgoing bits are all coded bits, and there are no 'naked' information bits anymore. The number of incoming bits (information bits) to the encoder is smaller than the number of outgoing bits (information bits plus inserted coded bits, or all coded bits). The ratio of incoming/outgoing bits is called the 'code rate R' (typ.R= 1:2). For example, prominent channel codes are block codes and convolutional codes; the latter ones can be recursive or non-recursive.

Concatenated coding schemes apply (at least) two parallel or serially concatenated encoders. By this, the same information sequence gets encoded twice, either in a parallel or in a serial fashion. There are iterative decoding algorithms for either parallel or serially concatenated coding systems (Benedetto, S., Divsalar, D., Montorsi, G., and Pollara, F. 'Serial concatentation of interleaved codes: performance analysis, design and iterative decoding', IEEE Trans.Inf.Theory, 1998, 44,(3), pp.909–926).

FIG. 1 shows a genuine serially concatenated coding scheme. The transmission is done on a block-by-block basis. The signal sequence is encoded twice at the transmitter in a serial manner. The binary signal from the digital source (e.g. an analog to digital converter with analog input signal from a microphone) is first encoded by an outer encoder (code rate Ro). The output of the outer encoder is passed through a bit interleaver which changes the order of the incoming bit symbols to make the signal appear more random to the following processing stages. After the interleaver the signal is encoded a second time by an 'inner encoder' (code rate R1). The overall code rate of the transmitted signal is Ro . R1. Correspondingly, at the receiver the signal is first decoded by the inner decoder, deinterleaved, and decoded by the outer decoder. From the outer decoder soft values are fed back as additional 'a priori' input to the inner decoder. The soft values are reliability values of the quality of the decoded signal. The feedback of these values helps to reduce the bit error rate of the hard decision values 0,1 at the output of the outer decoder in further, iterative decoding steps. The iterative decoding of a particular transmitted sequence is stopped with an arbitrary termination criterion, e.g. after a fixed number of iterations, or until a certain bit error rate is reached. It should be noted that the 'a priori' soft value input to the inner decoder is set to zero for the very first decoding of the transmitted bit sequence ('$0^{th}$ iteration'). Furthermore, the hard decisions on the information bits need to be calculated only once for each sequence, namely in the final pass (last iteration) through the outer decoder.

In general the inner and outer binary codes can be of any type: Systematic, or non-systematic, block or convolutional codes, recursive, or non-recursive.

At the receiver the two decoders are soft-in/soft-out decoders (SISO-decoder). A soft value represents the reliability on the bit decision of the respective bit symbol (whether 0 or 1 was sent). A soft-in decoder accepts soft reliability values for the incoming bit symbols. A soft-out decoder provides soft reliability output values on the outgoing bit symbols. The soft-out reliability values are usually more accurate than the soft-in reliability values since they can be improved during the decoding process based on the redundant information that is added with each encoding step at the transmitter. The best performance as a SISO-decoder provides the A Posteriori Probability calculator (APP) (L. Bahl, J. Cocke, F.Jelinek, J. Raviv, "Optimal decoding of linear codes for minimizing symbol error rate", IEEE Trans.IT., vol, 20, pp. 284–287, March 1974), tailored to the respective channel code. Several faster, but sub-optimal algorithms exist, e.g. the SOVA (soft output Viterbi algorithm) (J. Hagenauer, P. Hoeher, "A Viterbi algorithm with soft-decision outputs and its applications", in Proc. IEEE Globecom 1989, Dallas, Texas, pp. 47.1.1–457.1.7, Nov. 1989) In the iterative decoding path 'outer extrinsic information' is passed through the bit interleaver and fed back as a priori knowledge to the inner decoder. The 'outer extrinsic' information is the difference of the soft input/soft output values at the outer decoder and depicts the new, statistically independent information (at least for the first iteration) gained by the outer decoding process. Correspondingly, the inner decoder provides 'inner extrinsic' information and channel information (FIG. 1).

SUMMARY OF THE INVENTION

Against this background the invention recognises that there are special advantages to be had from a particular coding arrangement.

In accordance with the invention, there is provided a channel decoder for data encoded by serially concatenated outer and inner codes in which the outer code is a rate 1:2 repetition code operative to encode a data bit $b_n$ as two identical coded bits$_{bcoded.n0,bcoded.n1}$ and in which the coded bits are interleaved, the decoder comprising a soft input soft output (SISO) inner decoder for which the input and output information are log likelihood ratios, input information being the log likelihood ratios of the encoded data and outer extrinsic information; means for subtracting feedback outer extrinsic information from the inner decoder output information to produce inner extrinsic information; means for swapping the log likelihood ratios $L_{n0},L_{n1}$, in the inner extrinsic information, corresponding to one information bit $b_n$ to produce the feed back extrinsic information, said coder being operative iteratively with outer extrinsic information produced by previous iterations; means for summing the pairs, corresponding to one data bit $b_n$, of log likelihood ratios $L_{n0},L_{n1}$ of the inner extrinsic information; and means for making a hard decision based on the summed log likelihood ratios. The arrangement is especially simple compared with other decoders proposed in the prior art, especially when it is realised that the means for swapping can perform the swap without separate steps of deinterleaving and interleaving.

It is normally arranged for the first iteration to set the feedback outer extrinsic information at zero.

The invention also extends to a method for decoding channel information containing data encoded by serially concatenated outer and inner codes in which the outer code is a rate 1:2 repetition code operative to encode a data bit $b_n$ as two identical coded bits $b_{coded,n0}, b_{coded,n1}$ and in which the coded bits are interleaved, comprising decoding channel information being the log likelihood ratios of received encoded data using outer extrinsic information to produce inner decoded log likelihood ratio information; subtracting feedback outer extrinsic information from the inner decoded log likelihood ratio information to produce inner extrinsic information; swapping the log likelihood ratios $L_{n0}, L_{n1}$, in the inner extrinsic information, corresponding to one information bit $b_n$ to produce the feed back extrinsic information, performing said decoding iteratively with outer extrinsic information produced by previous iterations; summing the pairs, corresponding to one data bit $b_n$, of log likelihood ratios $L_{n0}, L_{n1}$ of the inner extrinsic information; and making a hard decision based on the summed log likelihood ratios.

BRIEF DESCRIPTION OF THE DRAWINGS

An embodiment of the invention will now be described, by way of example, with reference the accompanying drawings, in which.

DETAILED DESCRIPTION

Figure 1:
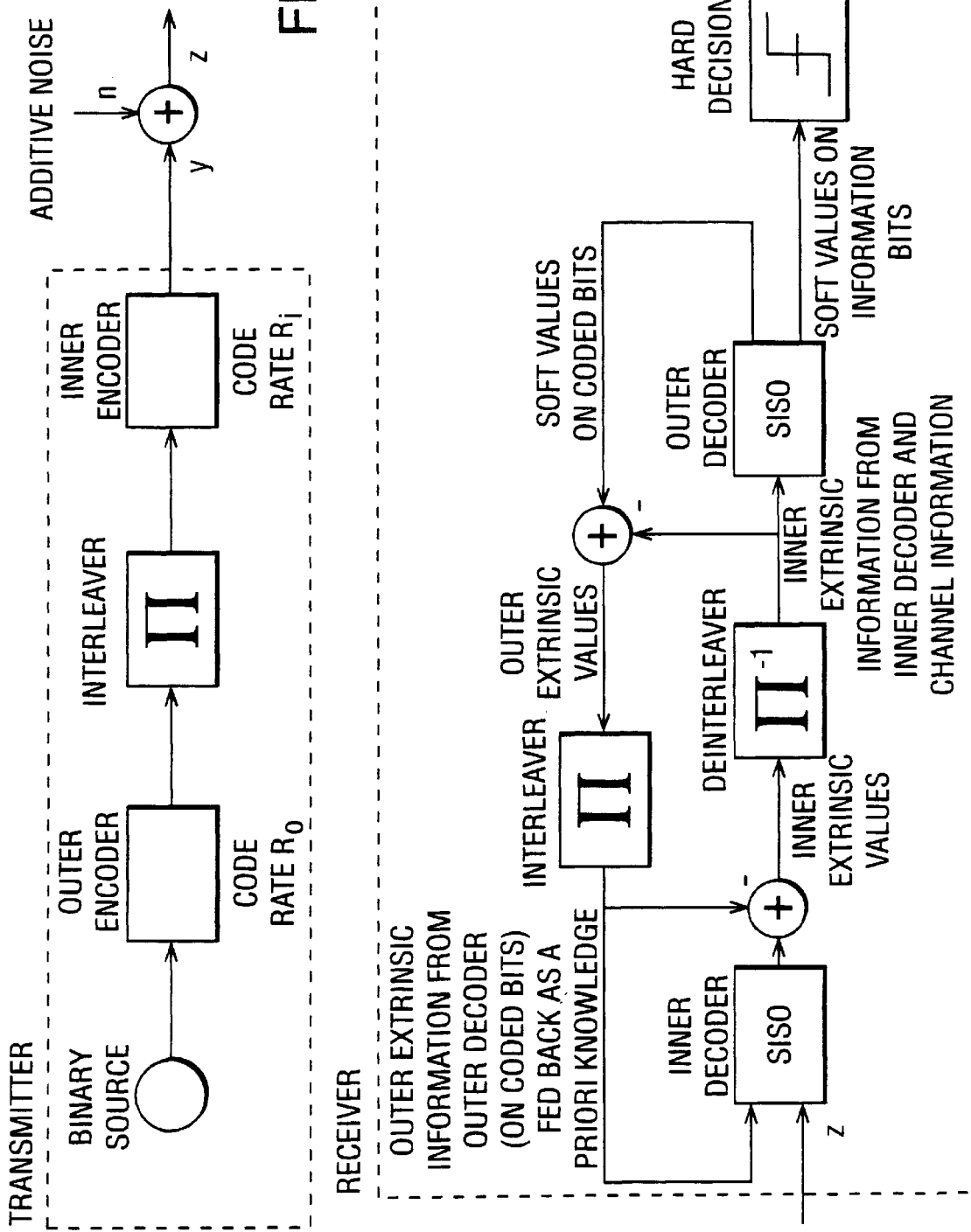
FIG. 1 is a block diagram of a prior art serially concatenated coder and decoder with iterative decoding.
Figure 2:
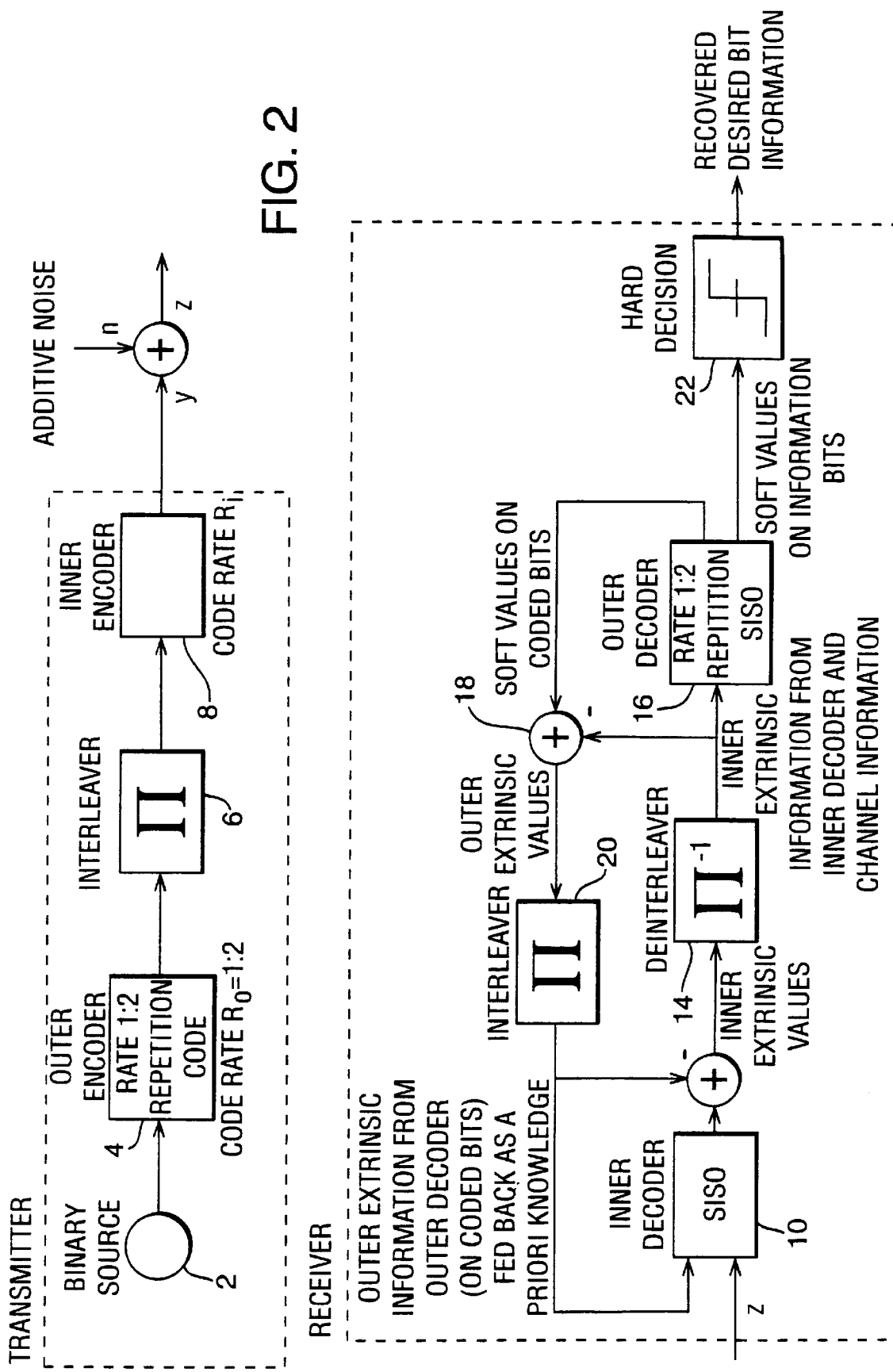
FIG. 2 is a block diagram of a serially concatenated coder and a decoder embodying the invention.

Referring to FIG. 2 of the drawings, a source of binary data 2 supplies data to an outer rate 1:2 repetition encoder 4. For each data bit input $b_n$ to the encoder 4 there are two identical output coded bits $b_{coded,n0}, b_{coded,n1}$. The coded bits in a block of data are interleaved by an interleaver 6 according to a predetermined pattern so that the block appears more random to the following stages. The interleaved bits are then coded by another encoder 8.

The coded information output from the inner encoder 8, is transmitted through a medium where it is degraded by additive noise.

The degraded coded information received through the medium is input to a soft in soft out (SISO) inner decoder 10 with outer extrinsic information, both in the form of log likelihood ratios. Initially the extrinsic information is set to zero representing an equal likelihood of the bit being zero or one.

The feed back outer extrinsic information (in the form of log likelihood ratios) is subtracted by an adder 12 from the inner decoder output information (also in the form of log likelihood ratios) to provide inner extrinsic values to an input of a deinterleaver 14. The output of the deinterleaver represents inner intrinsic information from the inner decoder and channel information. This is input to a rate 1:2 repetition decoder 16.

An output of the outer decoder 16 provides soft values on coded bits in the form of log likelihood ratios. The inner extrinsic information is subtracted from these by a summer 18 to provide outer extrinsic values. These are interleaved by an interleaver 20 to provide the outer extrinsic information.

The decoders operate iteratively, so that for the second iteration, the outer extrinsic information from the first iteration is used, and so on. After some predetermined criterion is met the iterations are terminated and soft values on information bits (in the form of log likelihood ratios) are output to a discriminator to make a hard decision on each bit. The criterion could be a predetermined number of iterations, e.g. 4, or when the change in values between an iteration and the next is less than a threshold.

In L-value notation the $L_{0coded} = L_{1coded} = L_{coded} = L_0 + L_1$

L value notation is explained in (J. Hagenauer, "The Turbo Principle: Tutorial Introduction and State of the Art", Symposium on Turbo Codes, Brest, France, September 1997).

$L_0$ and $L_1$ are the two input L-values to the decoder (since the code rate is 1:2, there are two values for each "repetition code"—codeword).

For the rate 1:2 repetition code it turns out that $L_{info} = L_{coded}$.

To recover the desired bit information one needs to take the hard decision (sign) on the $L_{info}$—values at the output of the decoder.

Most importantly, the extrinsic output values (which are fed back to the inner decoder during the iterative decoding process) are calculated as $$L_{0,extr} = L_{0,coded} - L_0 = L_1$$

$$L_{1,extr} = L_{0,coded} - L_1 = L_0$$

Hence, the extrinsic decoder output values can be obtained by just exchanging ("swapping") the two input values $L_0$ and $L_1$ per "repetition code"—codeword.

Figure 3:
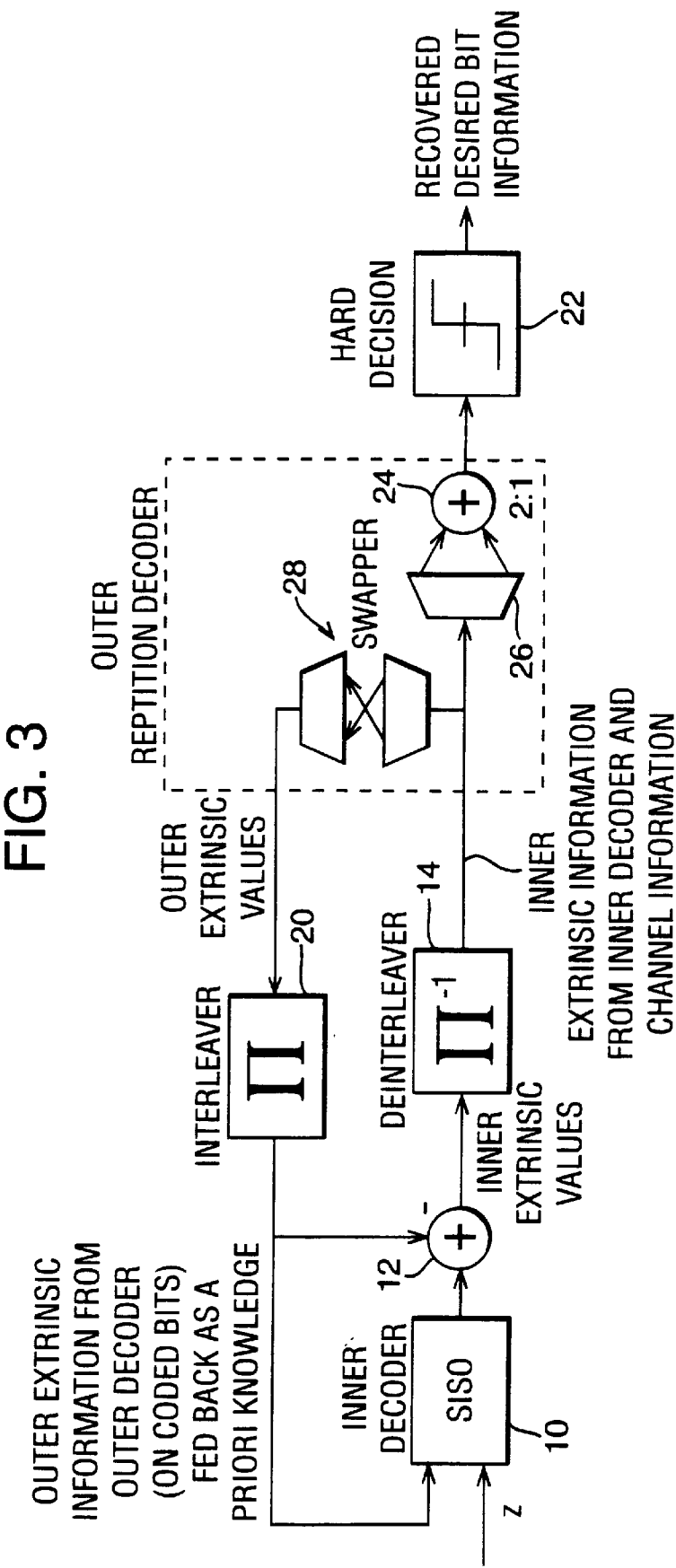
FIG. 3 is a block diagram showing a simplified arrangement of the decoder of FIG. 2.

FIG. 3 shows how this may be used to simplify the outer decoder. Here the outer repetition decoder 16 and summer 18 are replaced by an adder 24 and buffer 26. The buffer 26 stores two consecutive values from the inner extrinsic information, with values $L_{n0}, L_{n1}$ corresponding to one data bit $b_n$. These are added in the adder 24 to provide the soft values on information bits input to the discriminator 22. The values are also input to a buffer 28 from which they are read in reverse order (swapped) to provide the stream of outer extrinsic values input to the deinterleaver 20.

Figure 4:
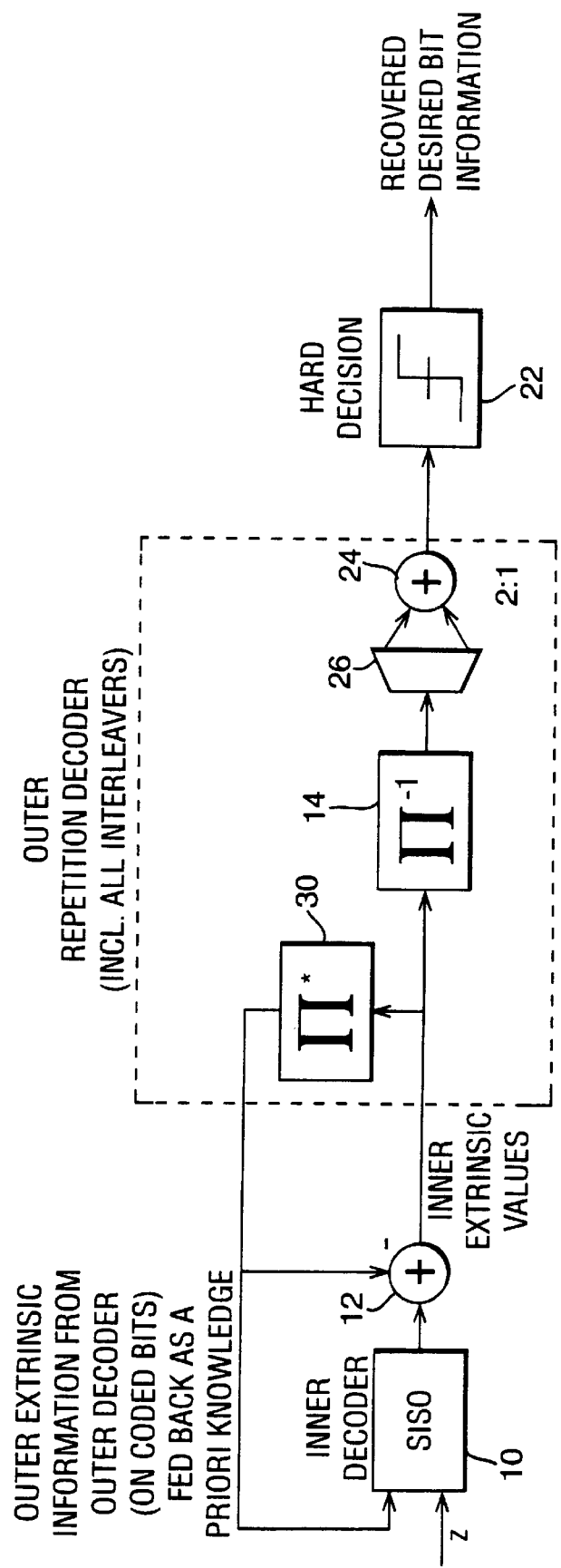
FIG. 4 is a block diagram showing a further simplification of the decoder of FIG. 3.

A further simplification is shown in FIG. 4. Here the buffer 28, deinterleaver 14, swapper 28 and interlever 20 of FIG. 3 are combined in a single unit (interlever 30) which directly swaps those values $L_{n0}, L_{n1}$ corresponding to one data bit $b_n$, from the inner extrinsic values output from the adder 12, without first deinterleaving them.

It is particularly attractive to use an inner rate 1:2 recursive systematic code, punctured to obtain a rate 1 inner code (half of the inner encoded bits are removed). Together with the outer rate 1:2 repetition code this results in an overall code rate of 1:2. Note that no redundancy is added in the inner encoder. The number of incoming bits is the same as the number of outgoing bits at the inner encoder.

The puncturing pattern to remove half of the encoded bits at the output of the inner encoder is arbitrary, but must be known to the receiver. However, there are two constraints: 1. At time instant k one can either remove the information but $I_k$ or the associated parity bit $p_k$ but not both. 2. There must always be some parity bits remaining in the encoded sequence, otherwise iterative decoding is not possible.

Examples of puncturing patterns to obtain a rate 1 code from a rate 1:2 mother code:
1. Remove all information bits, such that the encoded bit sequence consists of solely parity bits. $P_0, P_1, P_2, P_3 \ldots$
2. Remove half of the information bits, and half of the parity bits. $I_0, P_1, i_2, P_3, \ldots$
3. Remove ⅔ of the information bits, and ⅓ of the parity bits. $I_0, P_1, P_2, i_3, P_4, P_5 \ldots$ The different puncturing patterns 1., 2., 3. and 4. result in different bit error rate BER) behaviour of the concatenated code if decoded iteratively. The fewer information bits are involved, the later the turbo cliff (in terms of signal-to-noise-ratio), but the lower the bit error rate floor.

What is claimed is:

1. A channel decoder for data encoded by serially concatenated outer and inner codes in which the outer code is a rate 1:2 repetition code operative to encode a data bit $b_n$ as two identical coded bits $b_{coded,n0}, b_{coded,n1}$ and in which the coded bits are interleaved, the decoder comprising:
   a soft input soft output (SISO) inner decoder for which the input and output information are log likelihood ratios, input information being the log likelihood ratios of the encoded data and outer extrinsic information;
   subtractor adapted to subtract feedback outer extrinsic information from the inner decoder output information to produce inner extrinsic information;
   swapping circuit adapted to swap means for swapping the log likelihood ratios $L_{n0}$,—and $L_{n1}$,—in the inner extrinsic information; and corresponding to one information bit $b_n$ to produce the feed back extrinsic information, said channel decoder being operative iteratively with outer extrinsic information produced by previous iterations;
   combiner adapter to sum the pairs, corresponding to one data bit $b_n$, of log likelihood ratios $L_{n0}$—and $L_{n1}$ of the inner extrinsic information; and
   decision circuit adapted to make a hard decision based on the summed log likelihood ratios.

2. A decoder as claimed in claim 1, arranged for the first iteration to set the feedback outer extrinsic information at zero.

3. A decoder as claimed in claim 1 or 2, wherein the swapping circuit performs the swap without separate steps of deinterleaving and interleaving.

4. A method for decoding channel information containing data encoded by serially concatenated outer and inner codes in which the outer code is a rate 1:2 repetition code operative to encode a data bit $b_n$ as two identical coded bits $b_{coded,n0}, b_{coded,n1}$ and in which the coded bits are interleaved, comprising the steps of:
   (a) decoding channel information being the log likelihood ratios of received encoded data using outer extrinsic information to produce inner decoded log likelihood ratio information;
   (b) subtracting feedback outer extrinsic information from the inner decoded log likelihood ratio information to produce inner extrinsic information;
   (c) swapping the log likelihood ratios $L_{n0}$,—and $L_{n1}$, in the inner extrinsic information and, corresponding to one information bit $b_n$ to produce the feed back extrinsic information;
   (d) performing said decoding iteratively with outer extrinsic information produced by previous iterations;
   (e) summing the pairs, corresponding to one data bit $b_n$, of log likelihood ratios $Ln_{n0}$, —and $L_{n1}$ of the inner extrinsic information; and
   (f) making a hard decision based on the summed log likelihood ratios.

5. A method as claimed in claim 4, wherein for the first iteration the feedback outer extrinsic information is set at zero.

6. A method as claimed in claim 4 or 5, wherein the de-interleaving, swapping and interleaving steps are performed in a single step without separate steps of deinterleaving and interleaving.

* * * * *

UNITED STATES PATENT AND TRADEMARK OFFICE
CERTIFICATE OF CORRECTION

PATENT NO.     : 6,629,287 B1
DATED          : September 30, 2003
INVENTOR(S)    : Stephan ten Brink It is certified that error appears in the above-identified patent and that said Letters Patent is hereby corrected as shown below:

Column 5,
Line 28, replace "swapping circuit adapted to swap means for swapping" with -- swapping circuit adapted to swap --.
Line 29, replace "ratios $L_{n0}$,-and $L_{n1}$,-in the inner" with -- ratios $L_{n0}$ and $L_{n1}$ in the inner --.
Line 30, replace "extrinsic information, and" with -- extrinsic information and --.
Line 36, replace "ratios $L_{n0}$-and $L_{n1}$" with -- ratios $L_{n0}$ and $L_{n1}$ --.

Column 6,
Line 20, replace "ratios $L_{n0}$,-and $L_{n1}$, in the inner extrinsic information and," with -- ratios $L_{n0}$ and $L_{n1}$ the inner extrinsic information and --.
Line 27, replace "ratios $L_{n0}$,-and $L_{n1}$ of the inner" with -- ratios $L_{n0}$ and $L_{n1}$ of the inner --.

Signed and Sealed this

Sixth Day of January, 2004

JAMES E. ROGAN
*Director of the United States Patent and Trademark Office*